(12) United States Patent
Strauss et al.

(10) Patent No.: US 12,157,268 B2
(45) Date of Patent: Dec. 3, 2024

(54) THERMO OPTICAL CONTROL OF FOCUS POSITION OF AN ENERGY BEAM IN AN ADDITIVE MANUFACTURING APPARATUS

(71) Applicant: CSIR, Brummeria (ZA)

(72) Inventors: Hencharl Strauss, Pretoria (ZA); Darryl Naidoo, Pretoria (ZA)

(73) Assignee: CSIR, Pretoria (ZA)

( * ) Notice: Subject to any disclaimer, the term of this patent is extended or adjusted under 35 U.S.C. 154(b) by 910 days.

(21) Appl. No.: 17/255,290

(22) PCT Filed: Jun. 26, 2019

(86) PCT No.: PCT/IB2019/055373
§ 371 (c)(1),
(2) Date: Jun. 10, 2021

(87) PCT Pub. No.: WO2020/003142
PCT Pub. Date: Jan. 2, 2020

(65) Prior Publication Data
US 2021/0268741 A1    Sep. 2, 2021

(30) Foreign Application Priority Data
Jun. 27, 2018   (ZA) ................................ 2018/04309

(51) Int. Cl.
*B29C 64/153*      (2017.01)
*B22F 10/31*       (2021.01)
(Continued)

(52) U.S. Cl.
CPC ............ *B29C 64/153* (2017.08); *B22F 10/31* (2021.01); *B22F 10/36* (2021.01); *B22F 10/80* (2021.01);
(Continued)

(58) Field of Classification Search
None
See application file for complete search history.

(56) References Cited

U.S. PATENT DOCUMENTS

| | | |
|---|---|---|
| 2005/0083987 A1 | 4/2005 | Hunt et al. |
| 2010/0008389 A1 | 1/2010 | Jackson et al. |

(Continued)

FOREIGN PATENT DOCUMENTS

| | | | |
|---|---|---|---|
| CN | 207114861 U | * | 3/2018 |
| CN | 207127391 U | * | 3/2018 |

(Continued)

OTHER PUBLICATIONS

Machine translation of CN 207114861U (Year: 2024).*
(Continued)

*Primary Examiner* — Geoffrey S Evans
(74) *Attorney, Agent, or Firm* — Sheridan Ross P.C.

(57) ABSTRACT

A control system for thermo optical control of focus position of an energy beam in an additive manufacturing apparatus has a first doped medium and a second doped medium, each of which is optically transparent and doped with a dopant. The first doped medium has a positive thermo-optical coefficient (dn/dT) and the second doped medium has a negative thermo-optical coefficient (dn/dT) and is in series with the first doped medium. An energy beam input or coupling is configured to generate or receive an energy beam that is required to be controlled, the energy beam being within a first wavelength range and directed towards the first and second doped mediums. An absorbed beam input or coupling is configured to generate or receive at least one absorbed beam in a second wavelength range which is different from the first wavelength range, the absorbed beam being directed towards the first and second doped mediums. The first and second doped mediums have a higher beam absorption characteristic in the second wavelength range (Continued)

than in the first wavelength range, causing the absorbed beam to have a higher absorption than the energy beam in the first and second doped mediums and the first and second doped mediums each have a coating which allows transmission at both the first and the second wavelength ranges.

19 Claims, 4 Drawing Sheets

(51) Int. Cl.
  *B22F 10/36* (2021.01)
  *B22F 10/80* (2021.01)
  *B22F 12/40* (2021.01)
  *B22F 12/41* (2021.01)
  *B22F 12/44* (2021.01)
  *B22F 12/49* (2021.01)
  *B22F 12/90* (2021.01)
  *B23K 26/03* (2006.01)
  *B23K 26/342* (2014.01)
  *B23K 26/70* (2014.01)
  *B28B 1/00* (2006.01)
  *B28B 17/00* (2006.01)
  *B29C 64/268* (2017.01)
  *B29C 64/393* (2017.01)
  *B33Y 30/00* (2015.01)
  *B33Y 50/02* (2015.01)
  *G02F 1/29* (2006.01)
  *H01S 5/00* (2006.01)

(52) U.S. Cl.
  CPC .............. *B22F 12/41* (2021.01); *B22F 12/44* (2021.01); *B22F 12/49* (2021.01); *B22F 12/90* (2021.01); *B23K 26/032* (2013.01); *B23K 26/342* (2015.10); *B23K 26/705* (2015.10); *B28B 1/001* (2013.01); *B28B 17/0081* (2013.01); *B29C 64/268* (2017.08); *B29C 64/393* (2017.08); *B33Y 30/00* (2014.12); *B33Y 50/02* (2014.12); *G02F 1/29* (2013.01); *G02F 2203/21* (2013.01); *H01S 5/005* (2013.01)

(56) References Cited

U.S. PATENT DOCUMENTS

2011/0080663 A1    4/2011  Arain et al.
2013/0341309 A1   12/2013  Yamamoto et al.

FOREIGN PATENT DOCUMENTS

| DE | 102014104974 A1 | * | 10/2015 | ............ G02B 7/008 |
| EP | 3067132 | | 9/2016 | |
| JP | 2002314179 A | * | 10/2002 | |
| JP | 2010-096788 | | 4/2010 | |
| WO | WO-2018234984 A1 | * | 12/2018 | ........... B29C 64/393 |

OTHER PUBLICATIONS

Machine translation of DE102014104974A (Year: 2024).*
Machine translation of CN-207127391-U(Year: 2024).*
Machine translation of JP2002314179A (Year: 2024).*
Muzammil et al. "Adaptive beam shaping by controlled thermal lensing in optical elements," Applied Optics, Apr. 2007, vol. 46, No. 12, pp. 2153-2165.
Scaggs et al. "Thermal lensing compensation optics for high power lasers," SPIE Proceedings, Laser Resonators and Beam Control XIII, Feb. 2011, vol. 7913, 9 pages (Abstract only).
International Search Report and Written Opinion for International (PCT) Patent Application No. PCT/IB2019/055373, dated Oct. 25, 2019, 14 pages.
International Preliminary Report on Patentability for International (PCT) Patent Application No. PCT/IB2019/055373, dated Jun. 2, 2020, 13 pages.

* cited by examiner

THERMO OPTICAL CONTROL OF FOCUS POSITION OF AN ENERGY BEAM IN AN ADDITIVE MANUFACTURING APPARATUS

CROSS REFERENCE TO RELATED APPLICATIONS

This application is a national stage application under 35 U.S.C. 371 and claims the benefit of PCT Application No. PCT/IB2019/055373 having an international filing date of 26 Jun. 2019, which designated the United States, which PCT application claimed the benefit of South Africa Application No. 2018/04309 filed 27 Jun. 2018.

FIELD OF THE INVENTION

The invention relates to a control system for controlling an energy beam in a laser manufacturing apparatus. More particularly, this invention relates to additive manufacturing or laser manufacturing employing a high speed, kilowatt power level laser, scanner system. The invention also relates to an additive manufacturing apparatus.

BACKGROUND OF THE INVENTION

There are many laser processes that require a high-power kilowatt laser. Stable beam parameters such as beam size and output power are particularly critical for Additive manufacturing (AM). AM will be used as the main application of this technology although it may also be used in other applications such as laser cutting, welding, etc.

Additive manufacturing (AM) refers to various processes used to synthesise a three-dimensional object (hereafter simply referred to as an "object" or "part"). Certain AM techniques are sometimes referred to as "3D printing". The Applicant refers to its previous PCT applications, namely PCT/IB2017/057992, PCT/IB2017/057991 and PCT/IB2018/054497, for background in this regard.

In AM, parts are typically manufactured by digitally slicing a three-dimensional computer-aided design (CAD) model into two-dimensional layers or images. These layers are then manufactured by curing, consolidating, melting, sintering or otherwise forming these layers from a raw material, typically in the form of a powder or fluid. For the sake of convenience, the terms "consolidating" or simply "forming" will hereinafter be used to refer to the forming of such layers, irrespective of the specific manner in which the layers are formed.

Parts can be produced from various raw materials, such as metals, polymers, ceramics, resins and gypsum. Further, various techniques are used to consolidate layers, including lasers, electron beams, other high energy beams, binders and thermal modules.

In the Applicant's experience, AM provides a number of advantages over traditional manufacturing methods. These advantages include the ability to manufacture highly complex parts which allows for weight reduction, integration of more functionality into parts and part count reduction. The process ensures relatively low material wastage due to the reusability of raw material, in addition to the freedom in part design and the obviation of the need for tooling.

A number of AM processes employ a laser to consolidate material in layers on a material bed to ultimately form a desired part. Such processes will hereinafter be referred to as "powder bed fusion processes". In powder bed fusion processes, a laser beam is typically directed by a number of optical components to a scanning unit. The laser beam (hereafter referred to as the energy beam) is then scanned across the surface of the powder bed and switched on and off based on the geometry of a CAD model to ensure that the desired layers are consolidated in the correct manner.

The material bed is supported on a build platform which is incrementally lowered as each new layer of the object is consolidated. After the bed is lowered, a fresh layer of material is then added to the material bed before the next layer is consolidated.

The energy beam travels along an optical path from its energy source (e.g. laser) ultimately to reach a surface of the material bed. This optical path may include a number of different optical components such as a collimator lens system, mirrors, spherical lenses, flat focus lenses, windows and scanning mirrors. All of these contribute to thermal lensing which alters the size of the laser beam on the powder bed.

The Applicant has found that it is important to maintain a constant power density and spot size on the surface of the material bed (within certain tolerances) in an AM apparatus to ensure that high quality parts are manufactured leading to a process with high repeatability.

Materials, from which optical components are made, such as fused silica, sapphire and other optical glasses and crystals may absorb and/or scatter some of the radiation of the energy beam as it is transmitted through them. This is also true of the components anti-reflection (AR) coatings which are a thin layer deposited on the surface of the component. Absorption heats the optical components themselves, resulting in a phenomenon known as "thermal lensing".

Thermal lensing may cause changes in the focusing properties of an affected optical component, namely add a focus shift and/or a deterioration to the transmitted energy beam wavefront as a result of optical aberrations. In broad terms, thermal lensing refers to the mostly quadratic phase change profile inside transmissive optical elements caused by a temperature profile within them (almost always heating). This problem is exacerbated in high-powered AM laser systems.

Thermal lensing may compromise the efficiency of the AM processes. If a part is to be manufactured according to certain tolerances, working outside of these tolerances lead to structural instabilities in the manufactured parts and prevents repeatability in the process.

The Inventors are aware of techniques that have been developed to address some of the issues associated with thermal lensing using moving lenses and deformable mirrors as described in PCT application PCT/IB2018/054497.

However, these methods have a number of shortcomings. Deformable mirrors are power limited, expensive and some require complicated measurement and calibration setups. The technique described in PCT/IB2018/054497 may also not be suitable for compact optical delivery systems.

A need therefore exists for a cheap, compact system and method which permits the correction of, or to compensate for, the effects of thermal lensing in optical components of a compact optical delivery system of an AM apparatus The Applicant proposes to rapidly adjust or compensate for thermal lensing of high power laser beams with specifically tailored and adjustable thermo-optical phase change profiles in specifically doped and coated optical materials.

The applicant proposes a device that adjusts the radius of curvature in order to compensate for thermal lensing elsewhere in the system.

SUMMARY OF THE INVENTION

Accordingly, the invention provides a control system for thermo optical control of focus position of an energy beam in an additive manufacturing apparatus, the control system including:
- a first doped medium and a second doped medium, each of which is optically transparent and doped with a dopant, wherein:
  - the first doped medium has a positive thermo-optical coefficient (dn/dT); and
  - the second doped medium has a negative thermo-optical coefficient (dn/dT) and is in series with the first doped medium;
- an energy beam input or coupling configured to generate or receive an energy beam that is required to be controlled, the energy beam being within a first wavelength range and directed towards the first and second doped mediums; and
- an absorbed beam input or coupling configured to generate or receive at least one absorbed beam in a second wavelength range which is different from the first wavelength range, the absorbed beam being directed towards the first and second doped mediums; and
- a control unit configured to control the energy beam input or coupling and/or the absorbed beam input or coupling, thereby to control an intensity of the energy beam and/or the absorbed beam,
- wherein the first and second doped mediums have a higher beam absorption characteristic in the second wavelength range than in the first wavelength range, causing the absorbed beam to have a higher absorption than the energy beam in the first and second doped mediums,
- and wherein the first and second doped mediums each have a coating which allows transmission at both the first and the second wavelength ranges.

In short, the absorbed beam(s) causes a controllable, focusing and/or defocusing of the energy beam, thereby controlling or compensating for thermal lensing elsewhere in the system.

The energy beam input may be any laser source/system that requires, or may intermittently require, its beam to be compensated or controlled, such systems include fibre lasers, diode pumped solid state lasers, diode lasers, etc.

The energy beam input may be a high power beam, in the order of watts, kilowatts or more. The energy beam input may be used in laser material processing applications like additive manufacturing, laser cladding, laser welding, laser cutting etc., for directed energy applications as well as for high power communications and lidar applications etch.

The term "energy beam" may refer to the energy beam before, inside, or after the first and second doped mediums.

Similarly, the term "absorbed beam" may refer to the absorbed beam before, inside, or after the first and second doped mediums. The absorbed beam input may be from a low-cost laser or a plurality of low cost lasers that are able to deliver variable average powers, such as diode lasers, delivery fibre-coupled diode lasers or other homogenised diode lasers. The absorbed beam may have a flat-top profile or a more Gaussian (Bell shaped) or even triangular profile etc. Such beam profiles can easily be generated by imaging various planes of the output of multimode fibre coupled laser diodes.

The absorbed beam input may be provided parallel to the transmitted energy beam input. The absorbed beam input may also be provided with an angular offset (i.e., not parallel) to the transmitted energy beam input.

The device may include a beam guiding component to guide the transmitted energy beam input and/or the absorbed beam input. The beam guiding component may be a dichroic mirror or beam-splitter. It is to redirect the energy beam by 90° degree and transmit the absorbing beams, or vice versa.

The absorption of at least one of the absorbed beams is converted to heat and will cause a temperature gradient within the first and second doped mediums. The temperature profile inside the material induces a refractive index profile variation whose magnitude is primarily dependent on the thermo-optical coefficient or coefficients (dn/dT) of the material. This results in the formation of an optical phase change profile within the doped medium.

In general the thermo-optical phase change profile may modify the radius of curvature of a transmitted energy beam and/or add spherical aberration to it. The term "modify" the energy beam means to transform its phase through a mostly quadratic thermo-optically induced phase change profile within the doped optical medium.

The controlled, thermal phase change profile compensates for thermal lensing elsewhere in the system by changing the energy beam's radius of curvature and/or adding spherically aberration of opposite magnitude to that present elsewhere in the system.

The energy beam is focused, collimated steered etc. by dedicated optical elements to its final application plane. The first and second doped mediums may only be used for compensation of thermal lensing in the system.

The type or extent of the thermo-optical phase change profile in the first and second doped mediums, induced by the pump absorbed beam(s), may depend on:
- absolute size and intensity of the absorbed beam(s) and the transmitted energy beam;
- relative intensity of the absorbed beam and the energy beam;
- cooling/heating arrangement of the doped optical medium;
- relative size of the absorbed beam(s) and the transmitted energy beam to each other and relative to the cooling/heating surfaces of the doped optical medium;
- position of the absorbed and transmitted energy beams relative to each other and relative to the cooling/heating surfaces of the doped optical medium;
- intensity profile of the absorbed beam(s);
- type of doped optical medium (especially its dn/dT coefficient).

If spherical aberrations are not dominant in the thermal lensing elsewhere in the system the absorbed beams have a flat top shape and the thermo-optical phase change profile is quadratic over the extent of the energy beam, being that of variable spherical lens which compensates for a beam focus shift. Such a phase transformation is only obtained if:
- The intensity profile of the absorbed beam input in a doped medium is circular and has a constant intensity distribution inside the circular area (circular flat-top).
- The energy beam input is smaller than the absorbed beam input. More than 99% of the energy of the energy beam input needs to be transmitted within the circular diameter boundary of the absorbed beam input.
- The doped material consists of a base material that is effectively isotropic in directions that are orthogonal to the propagation direction of the energy beam input.
- The energy and absorbed beam inputs are centred relative to each other and relative to the cooling surfaces of the medium.

If spherical aberration is significant in the thermal lensing present elsewhere in the optical delivery system, the shape of the absorbed beam may be varied to introduce spherical aberration of opposite magnitude to that elsewhere in the system, thereby compensating for them.

The energy beam input may be higher power, even an order of magnitude or more, than the absorbed beam input. An advantage of this may be that a relatively low power, low cost absorbed beam input can be used to control a relatively high power energy beam input.

The doped medium may have a positive thermo-optical coefficient or coefficients (dn/dT). Such a doped medium may be doped silicate glass, Vanadate ($VO_4$) or Yttrium Aluminium Garnet (YAG) etc. For a positive thermo-optical coefficient, the doped medium may act like a controllable positive (converging) lens.

The doped medium may have a negative thermo-optical coefficient or coefficients (dn/dT). Such a doped medium may comprise doped Yttrium Lithium Flouride (YLF) or Calcium Flouride ($CaF_2$), etc. For a negative thermo-optical coefficient, the doped medium may act like a controllable negative (diverging) lens.

Both types of mediums may be doped with Nd, Yb, Tm, Er, etc. referred to as the dopant. The function of the dopant is to selectively absorb only the absorbed beam inputs in a selected wavelength range.

Optical materials commonly used as base materials for laser gain materials (e.g., a crystalline or glass gain mediums) may be used as the medium.

It will be noted that in the present configuration, the doped medium may not significantly contribute to gain at either the first or second wavelengths of either the absorbed or energy beam inputs. While the dopants listed as examples are traditionally used in gain mediums, they do not fulfil this function for this present invention. The dopant may be merely to assist absorption and a resultant controlled heated zone within an optical material(s) that is transparent to the wavelength range of the transmitted energy beam input. For example, the transmitted energy beam input may have a wavelength of 1 μm and the absorbed beam input may have a wavelength of 792 nm. The dopant may be Th (thulium) and the medium may be $CaF_2$. This selection of components will compensate for the more common converging thermal lensing elsewhere in the optical delivery system by means of a controllable diverging lens in the doped medium.

Materials which are not traditional laser gain dopants may also be used. For example, such materials can be designed to optimally absorb low cost diode light, have very low absorption at energy beam wavelengths and to have high thermal conductivity.

The doped medium may not absorb the energy beam input. This may mean that 99.9%, alternatively, 99%, alternatively 95%, and alternatively 90%, of the transmitted energy beam is not absorbed. There may be minor losses of the energy beam input which, for the purposes of this specification, does not constitute absorbance. However, the absorbed beam input is, at least partially absorbed in the doped medium.

It will be noted that in the present configuration, an undoped medium may not significantly absorb either the first or second wavelengths of either the absorbed or energy beam inputs and thus will not be considered for active thermal lens compensation.

To reduce losses, the doped medium may be coated with a layer of material that causes the doped medium to be Anti-Reflective (AR) for which the reflective losses may be reduced primarily for the energy beam input wavelength range, and to a lesser extend for the absorbed beam input wavelength range. This may mean that 99.9%, alternatively, 99%, alternatively 95%, and alternatively 90%, of the energy and absorbed beam inputs(s) are not reflected by the surfaces of doped medium.

The doped medium may also be uncoated but Brewster cut to reduce losses to polarised energy beam inputs.

If fast thermal lens control is required, it is important that a doped medium/mediums having a high thermal conductivity be selected.

An efficient and effective doped medium may have the following properties:

High optical transmission and very little absorption and/or gain of the energy beam input;
Controllable absorption of the absorbed beam input via the doping concentration;
A high percentage of conversion of the absorbed beam input optical energy to thermal energy;
A high thermal conductivity;
Low reflective losses of the energy beam and absorbed inputs;
High damage thresholds to accommodate very high power/energy transmitted energy beam inputs; and
A high thermo-optical coefficient(s) (dn/dT).

All of these properties together may define a new class of optical material (thermo-optical shaping materials) which is different from conventional laser gain materials. Such materials need to be specially manufactured and are not yet commercially available as stock items.

A device with both focusing and defocusing abilities and which could act like a telescope for fine adjustments is proposed. It consists of two doped materials positioned in series (see FIG. 2), one with a negative dn/dT coefficient and one with a positive dn/dT coefficient. Both materials have a maximum of two absorbed beam inputs impinging on them in the configuration shown in FIG. 2. The wavelength range of one of the absorbed beam inputs could be such that it is not absorbed in at least one of doped materials, but is still in the second wavelength range such that it is reflected by the 45 degree Coupling mirror. Alternatively a second 45 degree Coupling mirror can be employed.

The device could also consist of a subset of these components which would give it a limited functionality depending on the user requirement.

The laser system may include a controller configured to control the absorbed beam input, thereby to control the absorbed beam input power. This can be done to the extent that the thermo-optical phase change profile is dependent on the absorbed beam input and the thermo-optical phase change profile may be adjusted or controlled by adjusting or controlling the absorbed beam input.

According to one aspect of the invention, there is provided a control system for controlling an energy beam in a laser manufacturing apparatus, including:

a beam sensor(s) configured to monitor at least one property of an energy beam directed onto a working surface by an optical arrangement;
a control unit in electronic communication with the beam or any other relevant sensor, the control unit being configured to receive, from the sensor, a value associated with at least one monitored properties;
analyse the received value or a processed received value to determine whether the received value or the processed received value is equal to a predefined value or within a predefined range of values; and
if the received value or the processed received value is not equal to the predefined value or is not within the predefined range of values, cause adjustment of at least one variable parameter associated with the energy beam.

For some aspects of the invention the control unit uses a lookup table instead of input from a monitoring sensor.

The sensor may be configured to monitor at least one property at or near a monitoring point along an optical path of the energy beam. The monitoring point may be between an energy source and a scanning unit of the optical arrangement.

Alternatively or additionally, the sensor may be configured to monitor at least one property at or near a focus zone at the working plane or in a conjugated plane. The sensor may be configured to monitor the energy beam input spot size and/or the size and shape of a melt pool (the consolidated area). The sensor or the system may include one or more sensing components, a beam splitter, a focusing lens, filters, and other optical components. The sensing component may include a camera or slit-scanners. The sensing component may include a "beam waist analyser" camera which is configured to monitor a plurality of axially spaced slices of the beam diameter. At least one property of the energy beam may include one or more of: a beam spot size, a spatial profile, a power density, a focus location, a beam waist size, a beam position, divergence, beam quality ($M^2$-value) and wave front.

The received values may be values of the property of the energy beam input and the processed received values may be thermal lensing values. In such cases, the predefined value or predefined range of values may be thermal lensing values. The control unit may be configured to process the received value to obtain the processed received value.

BRIEF DESCRIPTION OF THE DRAWINGS

The invention will now be further described, by way of example, with reference to the accompanying drawings.

In the drawings.

DETAILED DESCRIPTION WITH REFERENCE TO THE DRAWINGS

The following description of the invention is provided as an enabling teaching of the invention. Those skilled in the relevant art will recognise that many changes can be made to the embodiments described, while still attaining the beneficial results of the present invention. It will also be apparent that some of the desired benefits of the present invention can be attained by selecting some of the features of the present invention without utilising other features. Accordingly, those skilled in the art will recognise that modifications and adaptations to the present invention are possible and can even be desirable in certain circumstances, and are a part of the present invention. Thus, the following description is provided as illustrative of the principles of the present invention and not a limitation thereof.

Figure 1:
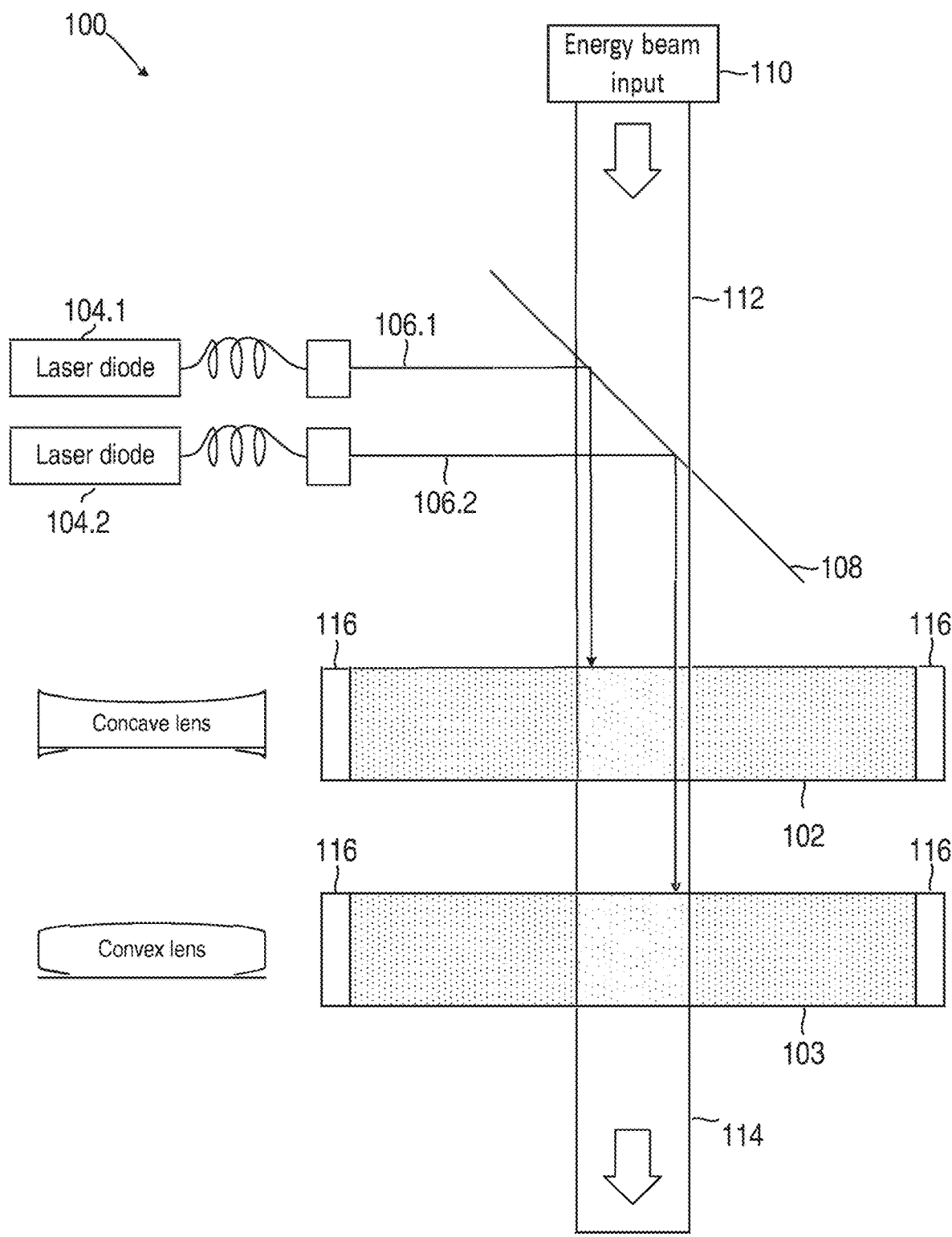
FIG. 1 illustrates a schematic side view of a first embodiment of a laser system in accordance with the invention.

FIG. 1 illustrates a first embodiment of a laser system 100 in accordance with the invention. The laser system 100 has two optically transparent mediums 102, 103 which are doped with a dopant (hence referred to as the first doped medium 102 and the second doped medium 103). The mediums 102, 103 are crystalline or glass mediums but which are not operated as gain mediums—in other cases (in accordance with prior art techniques), the same type of doped medium could be utilised as a gain medium in a conventional laser amplifier, with different anti reflective coatings on the surfaces of the medium.

Heating or cooling elements 116 may be provided at or near the doped mediums 102, 103 (e.g., at sides of the doped mediums 102, 103) to provide additional heating or cooling characteristics.

The laser system 100 has a plurality of absorbed beam inputs 104.1, 104.2 (referred to collectively by numeral 104). The absorbed beam inputs 104 are configured to generate respective absorbed beams 106.1, 106.2 (referred to collectively by reference numeral 106) at the second wavelength. In this example, the absorbed beam inputs are simple laser diodes 104, which are relatively cheap, compact, and readily available. In this example, a laser beam generated by such laser diodes 104 has a wavelength of 792 nm.

The various absorbed beams 106 are parallel to one another. The laser system 100 has a beam guiding component 108 in the form of a dichroic mirror 108 arranged diagonally at 45° between the laser diodes 104 and the doped mediums 102, 103 to redirect the absorbed beams 106 by 90°.

Figure 4:
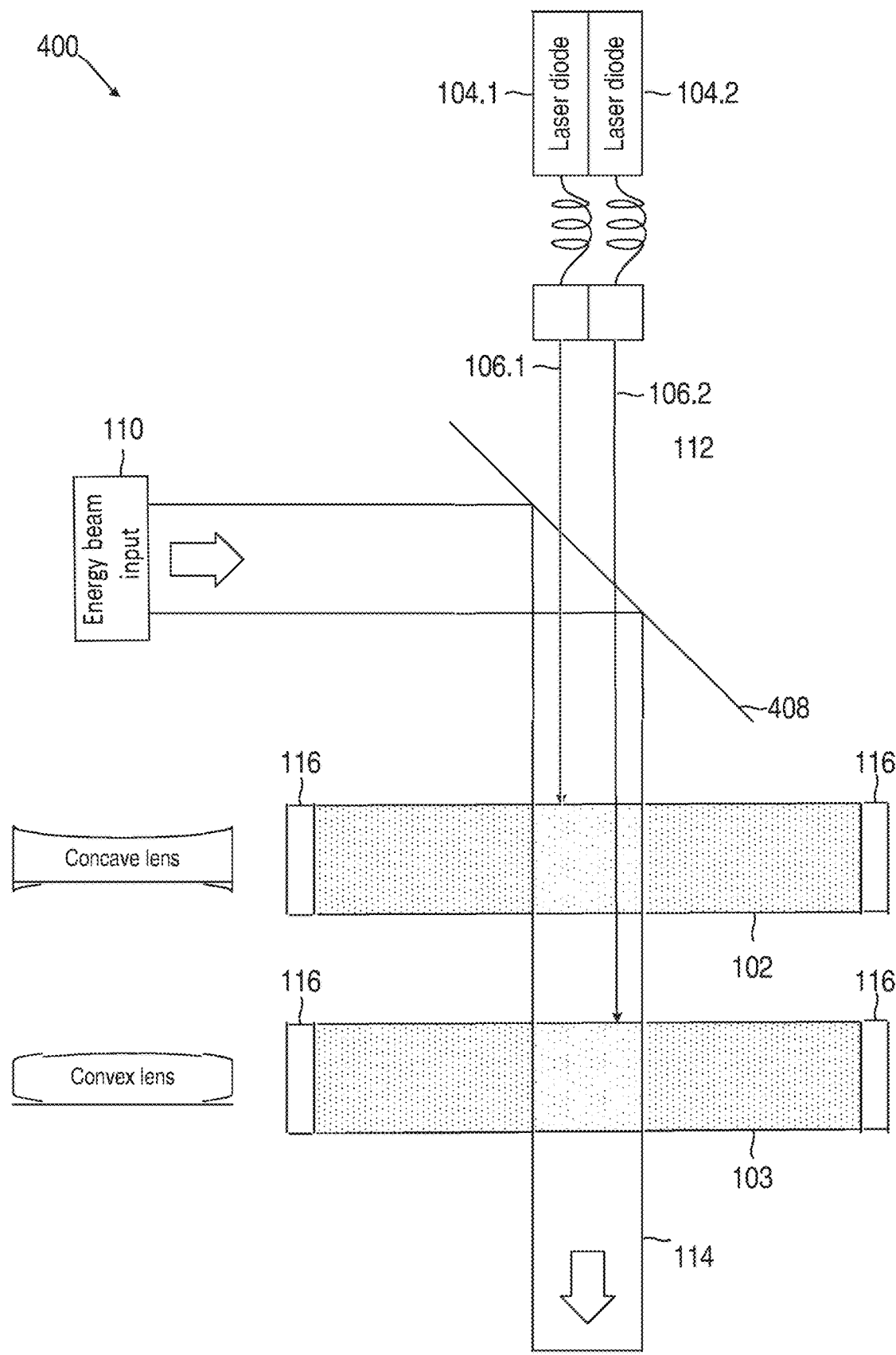
FIG. 4 illustrates a schematic side view of a second embodiment of a laser system in accordance with the invention.

FIG. 4 illustrates a slightly modified embodiment of laser system 200 compared to that of FIG. 1. The energy beam 112 is redirected by 90° by a dichroic mirror 408 and the absorbed beams 106 are transmitted, not redirected. The same or similar reference numerals in FIGS. 2 and 5 refer to the same or similar features.

The laser system 100 has an energy beam input 110 configured to generate or receive an energy beam 112 at the first wavelength. The energy beam input 110 directs the (input) energy beam towards the doped mediums 102, 103 and an output energy beam 114 exits on the other side.

In one embodiment (not illustrated), the energy beam input 110 may not itself generate the energy beam 112 but may be a coupler to receive the energy beam input 112 generated from an external laser generation device.

In this example, the first doped medium 102 is absorptive at a first wavelength range and the first laser diode 104.1 emits an absorbed beam 106.1 at the first wavelength. Similarly, the second doped medium 103 is absorptive at a second wavelength range and the second laser diode 104.2 emits the absorbed beam 106.2 at the second wavelength, the first and second wavelengths being different.

Importantly, at least some optical energy from the absorbed beams 106 is absorbed by the doped mediums 102, 103 and converted to heat. This causes the doped mediums 102, 103 to heat up in the region of the absorbed beams 106 and thereby induces a thermo-optical phase change profile.

If there is thermal lensing elsewhere (refer to system 300 of FIG. 3) and causes a focusing effect, but not a large variation in laser beam size of the energy beam input before the scanning mirrors, the power of an absorbed beam 106.1 that is absorbed in a device consisting of single negative dn/dT doped optical medium can be increased to compensate for the effect.

If there is thermal lensing elsewhere in the system 300 and causes a defocusing effect, but not a large variation in laser beam size of the energy beam input before the scanning mirrors, the power of an absorbed beam 106.2 that is absorbed in a device consisting of single positive dn/dT doped optical medium can be increased to compensate for the effect.

If there is thermal lensing elsewhere in the system 300 which causes a decrease in laser beam size of the energy beam input before the scanning mirrors, the power of both absorbed beams 106 that are absorbed in a device consisting of both a positive and a negative dn/dT doped optical mediums can be increased to compensate for the effect. The ratio of the power and distance between the two doped mediums would be such that the resultant effect would be that of a telescope.

If there is thermal lensing elsewhere in the system 300 which causes an increase in the laser beam size of the energy beam input before the scanning mirrors, 102 and 103 is interchanged and the power of two absorbed beams 106 that are absorbed in a device consisting of both a positive and a negative dn/dT doped optical mediums can be increased to compensate for the effect. The ratio of the power and distance between the two doped mediums would be such the resultant effect would be that of a telescope.

Figure 2:
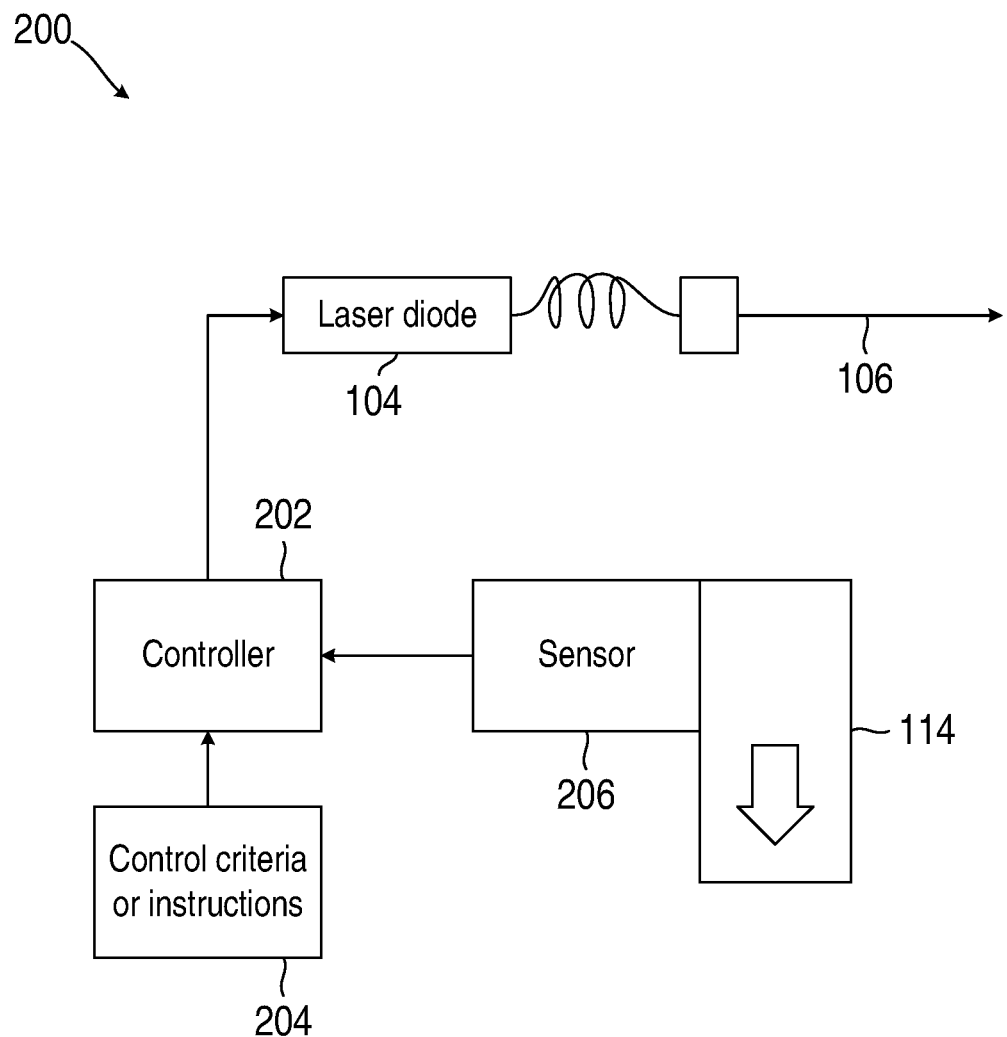
FIG. 2 illustrates a control system which may form part of the laser system of FIG. 1.

FIG. 2 illustrates a basic control system 200 which may form part of the laser system 100, 200. An electronic controller 202 can control the laser diode 104 to vary characteristics of the absorbed beams 106, e.g., their intensity. The controller 202 comprises control criteria or instructions 204 and may be embodied by a computer. Optionally, the control system 200 also includes a sensor or detector 206 to sense a characteristic of the output energy beam 114, or an effect of the output energy beam, thereby enabling the controller 202 to adjust the laser diode 104 according to a characteristic of the output energy beam 114—thus providing a feedback mechanism. This could be used to correct for transient thermal lensing in other optical elements through which the energy beam 114 is transmitted.

Figure 3:
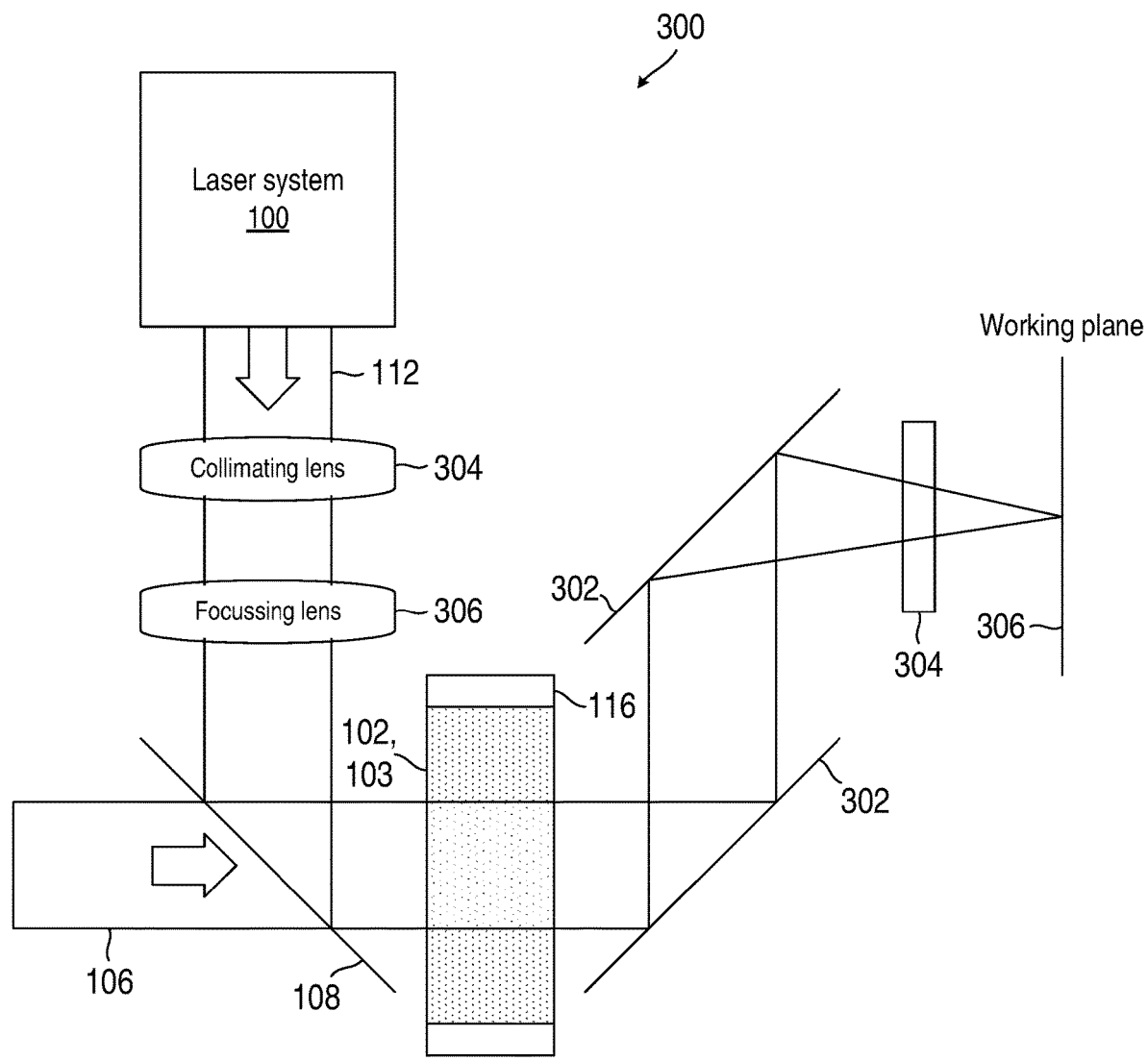
FIG. 3 illustrates an additive manufacturing system incorporating the laser system of FIG. 1.

FIG. 3 illustrates an additive manufacturing system 300 incorporating the laser system 100. The laser system 100 has been placed at a convenient position before the two scanning mirrors 302. Controllable quadratic thermal phase change profiles in doped mediums 102 or 103 would compensate for thermal lensing in optical components 304 (a collimating lens), 306 (a focusing lens) or 304 (a protective window).

Adjustment of at least one variable parameter may include adjustment of the power of at least one of the absorbed beam inputs.

The control unit may be configured to analyse the received value and/or the processed received value (from the sensor system) by applying a compensation algorithm in order to determine the amount of power allocated to individual absorbed beam inputs, thereby compensating for the effect of the measured distortion, or by changing the energy beam input size on the working surface as required.

What is claimed is:

1. A control system for thermo-optical control of focus position of an energy beam in an additive manufacturing apparatus, the control system including:
    a first doped medium and a second doped medium, each of which is doped with a dopant, wherein:
        the first doped medium has a positive thermo-optical coefficient (dn/dT), thus configured to act like a controllable positive (converging) lens; and
        the second doped medium has a negative thermo-optical coefficient (dn/dT), thus configured to act like a controllable negative (diverging) lens, and is in series with the first doped medium;
    an energy beam input or coupling configured to generate or receive an energy beam that is required to be controlled, the energy beam being within a first wavelength range and directed towards the first and second doped mediums;
    a plurality of absorbed beam inputs or couplings configured to generate or receive respective absorbed beams in a second wavelength range which is different from the first wavelength range, the respective absorbed beams being parallel to one another and being directed towards the first and second doped mediums; and
    a control unit configured to control the energy beam input or coupling and/or the plurality of absorbed beam inputs or couplings, thereby to control an intensity of the energy beam and/or the respective absorbed beams,
    wherein the first and second doped mediums have a higher beam absorption characteristic in the second wavelength range than in the first wavelength range, causing the respective absorbed beams to have a higher absorption than the energy beam in the first and second doped mediums and wherein the first and second doped mediums are optically transparent at the first wavelength range,
    and wherein the first and second doped mediums each have a coating which allows transmission at both the first and the second wavelength ranges.

2. The control system as claimed in claim 1, in which the energy beam input or coupling is any laser source/system that requires, or intermittently requires, its beam to be compensated or controlled.

3. The control system as claimed in claim 1, in which the energy beam has a power of greater than 1 kilowatt.

4. The control system as claimed in claim 1, in which the plurality of absorbed beam inputs or couplings are laser diodes, fiber-coupled diode lasers, or other homogenized diode lasers.

5. The control system as claimed in claim 1, which includes at least one beam guiding component to guide the energy beam and/or the respective absorbed beams.

6. The control system as claimed in claim 1, in which the respective absorbed beams, when absorbed, are converted to heat and causes a temperature profile within the first and second doped mediums.

7. The control system as claimed in claim 6, in which the temperature profile inside the first and second doped mediums induces a refractive index profile variation whose magnitude is primarily dependent on the thermo-optical coefficients (dn/dT) of the first and second doped mediums.

8. The control system as claimed in claim 7, in which the refractive index profile variation results in formation of an optical phase change profile within the first and second doped mediums.

9. The control system as claimed in claim 8, in which the optical phase change profile modifies a radius of curvature of the energy beam and/or adds spherical aberration to it.

10. The control system as claimed in claim 8, in which the optical phase change profile in the first and second doped mediums, induced by the respective absorbed beams, depends on one or more of:
    absolute size and intensity of the respective absorbed beams and the energy beam;
    relative intensity of the respective absorbed beams and the energy beam;
    cooling/heating arrangement of the first and second doped mediums;
    relative size of the respective absorbed beams and the energy beam to each other and relative to cooling/heating surfaces of the first and second doped mediums;

intensity profile of the respective absorbed beams; and type of doped optical medium.

11. The control system as claimed in claim 8, in which, if spherical aberrations are not dominant in thermal lensing, the respective absorbed beams have a flat top shape and the optical phase change profile is quadratic over an extent of the energy beam, being that of variable spherical lens which compensates for a beam focus shift.

12. The control system as claimed in claim 8, in which, if spherical aberration is significant in an thermal lensing, a shape of the respective absorbed beams are varied to introduce spherical aberration of opposite magnitude to that causing the thermal lensing.

13. The control system as claimed in claim 1, in which the first and second doped mediums are a crystalline medium or a glass medium.

14. The control system as claimed in claim 1, in which the first and second doped mediums do not significantly contribute to gain at either the first or second wavelength ranges of the respective absorbed beams and/or the energy beam.

15. The control system as claimed in claim 1, in which:
the first and second doped mediums are coated with an Anti-Reflective (AR) layer.

16. The control system as claimed in claim 15, in which the first and second doped mediums have different absorption characteristics.

17. The control system as claimed in claim 1, in which a wavelength of one of the plurality of absorbed beam inputs is such that it is not absorbed in at least one of doped mediums, but is still in the second wavelength range.

18. The control system as claimed in claim 1, which includes:
at least one beam sensor configured to monitor at least one property of the energy beam directed onto a working surface by an optical arrangement,
wherein the control unit is in electronic communication with the beam sensor, the control unit being configured to receive, from the at least one beam sensor, a value associated with at least one monitored property, and wherein the control unit is configured to:
analyze the received value or a processed received value to determine whether the received value or the processed received value is equal to a predefined value or within a predefined range of values; and
if the received value or the processed received value is not equal to the predefined value or is not within the predefined range of values, cause adjustment of at least one variable parameter associated with the energy beam.

19. The control system as claimed in claim 18, in which the beam sensor is configured to monitor one or more of:
at least one property at or near a monitoring point along an optical path of the energy beam;
at least one property at or near a focus zone at a working plane or in a conjugated plane; and
an energy beam input spot size and/or a size and shape of a melt pool.

\* \* \* \* \*